(12) United States Patent
Zanchi et al.

(10) Patent No.: US 7,327,166 B2
(45) Date of Patent: Feb. 5, 2008

(54) REFERENCE BUFFER WITH IMPROVED DRIFT

(75) Inventors: Alfio Zanchi, Dallas, TX (US); Marco Corsi, Parker, TX (US)

(73) Assignee: Texas Intruments Incorporated, Dallas, TX (US)

( * ) Notice: Subject to any disclaimer, the term of this patent is extended or adjusted under 35 U.S.C. 154(b) by 46 days.

(21) Appl. No.: 11/206,406

(22) Filed: Aug. 18, 2005

(65) Prior Publication Data

US 2007/0040580 A1 Feb. 22, 2007

(51) Int. Cl.
*H03K 19/0175* (2006.01)
*G05F 1/10* (2006.01)

(52) U.S. Cl. .................. 326/85; 326/84; 327/541; 327/543; 341/143; 330/253; 330/260

(58) Field of Classification Search .............. 326/23, 326/27, 83, 84, 85; 327/538, 540, 541, 542, 327/543; 341/143; 330/253, 260
See application file for complete search history.

(56) References Cited

U.S. PATENT DOCUMENTS 6,094,155 A * 7/2000 Fees ........................... 341/172
6,259,322 B1 * 7/2001 Muza ......................... 330/257

* cited by examiner

*Primary Examiner*—Daniel Chang
(74) *Attorney, Agent, or Firm*—Wade J. Brady, III; Frederick J. Telecky, Jr.

(57) ABSTRACT

A reference voltage circuit having an open-loop buffer driven by a matching buffer included within a closed-loop, generates a stable differential or single-ended voltage while minimizing signal-dependent short-term and long-term drift. The open-loop buffer may be a replica of the closed-loop buffer, reducing the effect of a signal coupled on the voltage reference lines. The reference voltage circuit may be adapted for a switched capacitor ADC.

19 Claims, 10 Drawing Sheets

REFERENCE BUFFER WITH IMPROVED DRIFT

FIELD OF THE INVENTION

The present invention is related to reference voltage circuits, and more in particular to reducing noise and drift in voltage reference lines such as utilized by a switched-capacitor pipeline ADC.

BACKGROUND OF THE INVENTION

Analog-to-digital conversion algorithms implemented in silicon (successive approximation registers or SARs, switched-capacitor and switched-current pipelines, folding, flash, etc.) inherently rely on the stability, and low noise, of some internal reference voltage rails against which the input signals must be weighted. In particular, switched-capacitor implementations draw current out of the reference lines to charge/discharge the capacitors employed for processing the signal (in each stage's Multiplicative Digital-to-Analog Converter, or MDAC), usually taxing the reference lines more than in switched-current implementations. Moreover the flash sub-ADC found in the first stage of a switched-capacitor pipeline conversion chain measures the signal against a resistor (or capacitor) ladder, setting the comparator thresholds. Consequently, any error and/or noise affecting the voltage references directly impacts the performance of the whole ADC, without any possibility of correction unless some form of complicated, time-consuming background calibration is employed.

The general approaches addressing the need for stable voltage reference generation for an ADC can be divided into two categories: high-impedance and low-impedance implementations.

High-impedance techniques rely upon the adoption of massive external and internal capacitive decoupling. The capacitors are used as reservoirs to provide the charge necessary to supply the instant current required by the pipeline MDACs. Since the charge variation $\Delta q = C \cdot \Delta V$, the larger the decoupling capacitor C, the lesser the voltage perturbation affecting the voltage levels. Once the momentary current $I = dq/dt$ has flown from the reservoir capacitors to charge up the signal capacitors in the pipelined quantizer, the reference system has a fair amount of time (almost a whole half-clock period in pipeline schemes, see FIG. 10) to replenish the reservoirs in a slow, controlled fashion. Hence, a high-impedance output, slow-response Operational Transconductance Amplifier (OTA) can accomplish this result and be designed for low-consumption and low-noise at one time. Of course the output voltage of the loop established around the opamp can only be as stable as the reference voltage provided at its inputs, hence a stable input voltage will need to be provided first, for example out of a bandgap circuit.

Low-impedance techniques rely, instead, upon the speed and current-drive capability of a voltage buffer to provide temporarily higher currents, when the signal capacitors are being charged. No internal or external decoupling capacitors are employed on the output voltage lines in this approach, since any additional capacitive load would only slow down the settling transient. The speed of the buffer determines the settling time of the reference system, and sets the current consumption of the voltage reference. Class-A buffer solutions are, in general, more power-hungry as compared to Class-B or Class-AB solutions, where variable amounts of current can be delivered to the load without need for static consumption. The choice in this respect will be dictated by the distortion requirements at the end of the charging cycle.

To linearize the output impedance, while reducing it (by the loop gain) at the same time, and to set the voltage to a precise level, in prior art the buffer is usually closed into a negative feedback loop. This prior art configuration adopting a simple emitter-follower is shown in the schematic of circuit 10 in FIG. 1. The circuit 10 providing the desired reference voltage target to the driver/buffer 22 is ideally unaffected by the "kick-back" current surge that has to be provided to the input thereof, hence it can also be designed for low power and heavily filtered for low noise. This circuit 10 is usually implemented as a closed-loop OTA filtered by a capacitor, making the high-impedance approach a subset of this second solution.

SUMMARY OF INVENTION

The present invention achieves technical advantages as a reference voltage circuit having an open-loop driver, adopting a replica driver inside the classic closed-loop voltage reference circuit, and improving the isolation as needed in a few critical nodes.

This invention improves the stability of the voltage references in both the short and long term. In particular, this invention enhances the resiliency of the voltage reference to the instantaneous current surges generated by connecting capacitors to those voltage references through digital switches, as is typically done in switched-capacitors pipeline architectures. The present invention recognizes and solves the problem of long-term drift of the voltage references which is found to be consequence of an imperfect rejection, at low frequency, of the transients triggered by the current surges engendered at the output of the circuit.

DETAILED DESCRIPTION OF THE PRESENT INVENTION

The present invention is targeted at low-impedance voltage reference circuits. In one embodiment of the invention shown at 20 in FIG. 2, an open-loop buffer 24 implemented with bipolar or CMOS devices is utilized, based on the most elementary emitter-follower (or source-follower) topology.

Figure 2:
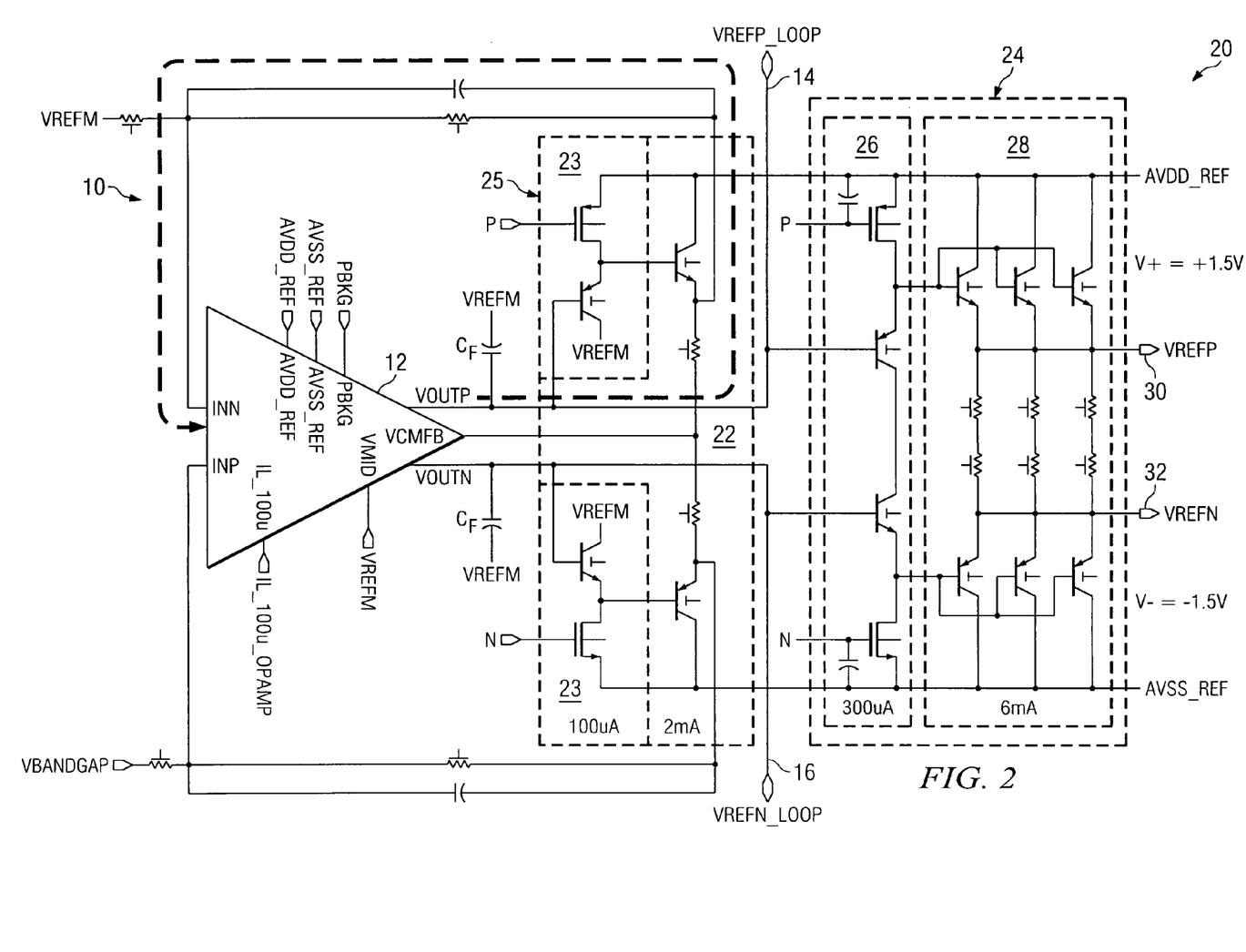
FIG. 2 is a schematic block diagram of one embodiment of the invention.

More complicated buffer schemes can be effortlessly accommodated in the frame in another embodiment of the invention. The simplicity of the open-loop buffer/driver 24 of the voltage reference lines indeed ensures extreme speed to the settling. Notice how the current flowing in the two devices (NPN, PNP) of the buffer 24 are conveniently and advantageously shared in the case of a differential system, where two differential voltage levels are to be generated at outputs 30 and 32. This solution is indeed more general in scope, and can also be advantageously adopted for single-ended systems without loss of efficiency.

In order to force the output voltage of the whole driver 20 to the desired, precise voltage level at outputs 30 and 32, such as needed for an ADC to operate with the required linearity, adoption of a strong negative feedback loop is provided. In the prior art circuit 10 of FIG. 1, this entails connecting an opamp 12 to monitor the voltage on the output lines 14 and 16 and regulate the bases (or gates) of the buffer 22 closed in the loop, to adjust the voltage back to the desired level.

Advantageously in one embodiment of the present invention, a buffer 25 is instead introduced within the voltage regulation loop as a replica buffer which matches the physical line driver, such that the driver 24 can now be operated in open-loop. As shown, Replica buffer 25 includes a pre-driver circuit 23 interposed between the opamp 12 and the respective NPN and PNP transistor of buffer 22. In this way, the inevitable coupling of voltage spikes and ensuing ringing onto the driving node of the buffer, such as caused by the ADC quantizer interaction with the voltage reference line, is greatly diminished. Hence, the precision feedback loop operates in a more stabilized way, which is one advantage of the invention. The matching of the replica buffer 25 to the line driver/buffer 24 in modern technologies is easily enough to guarantee a sufficiently accurate reproduction of the precision voltage generated by the feedback loop, at the voltage output lines 30 and 32, identified as VREP and VREFN. A factor equal to the emitter-base isolation afforded by the driver 24 topology quantifies the perturbation abatement, to the effect of the regulation loop. In the buffer 22 of circuit 10 depicted in FIG. 1, only one level of isolation is presented. Multiple buffers can indeed be cascaded to further improve the isolation, as shown at 24 in FIG. 2 which is composed of emitter followers 26 cascaded with transistors 28, with very moderate penalty on speed and power consumption. The adoption of cascaded buffers 26 and 28, at 24, to improve isolation is dictated by the identification of the coupled disturbance's rectification phenomenon as a main factor towards long-term instability of the voltage references.

Figure 1:
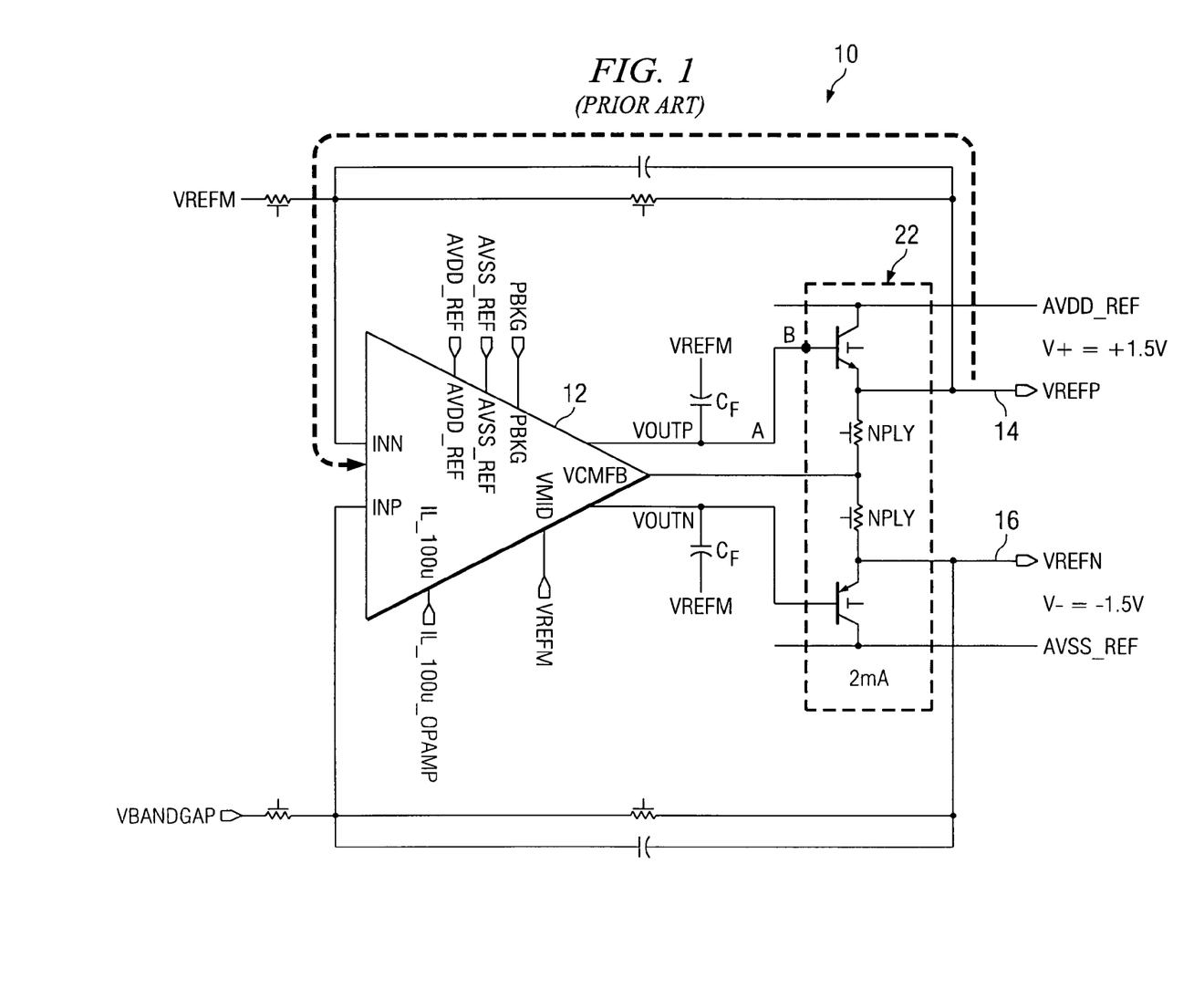
FIG. 1 is a schematic block diagram of a prior art circuit including a closed-loop negative feedback loop.

The action of the capacitor CF connected to the driving node of the output buffer 22 and 25, in FIGS. 1 and 2 respectively, is two-fold: it provides the necessary dominant pole compensation for the OTA 12 enclosed in the loop, and especially, it helps absorbing the residual voltage spikes that manage to bypass the buffer isolation. Capacitor values of a few nanofarads (on-chip) are not uncommon for the kind of precision required in high-speed ADC designs, and sometimes these nodes are even brought off the chip to allow for a larger capacitor to be used. This is analogous to the "charge sharing" mechanism described for the case of the decoupling caps vs. capacitors switched on the line: the larger the filtering cap put before the buffer is, the smaller the voltage perturbation will be. More precisely, in the circuit 10 of FIG. 1, only the slower frequency components of the voltage disturbance injected on the voltage lines will be abated by the static emitter-to-base isolation (a static factor of $\beta$, hence some 100's). Fast dynamic transients will directly couple from the emitter to the base through the parasitic capacitor $C\pi$ of the bipolar transistor (or through the parasitic capacitor Cgs in the MOSFET case); thus, it is the capacitive partition with the larger capacitor CF highlighted in the figure providing an isolation of $C_\pi/(C_F+C_\pi)$ against faster spectral components coupling to the voltage lines. By the same token, it is worth noting how multiple levels of staggered drivers, such as 26 and 28, improve both the static and dynamic isolation factors.

Figure 3:
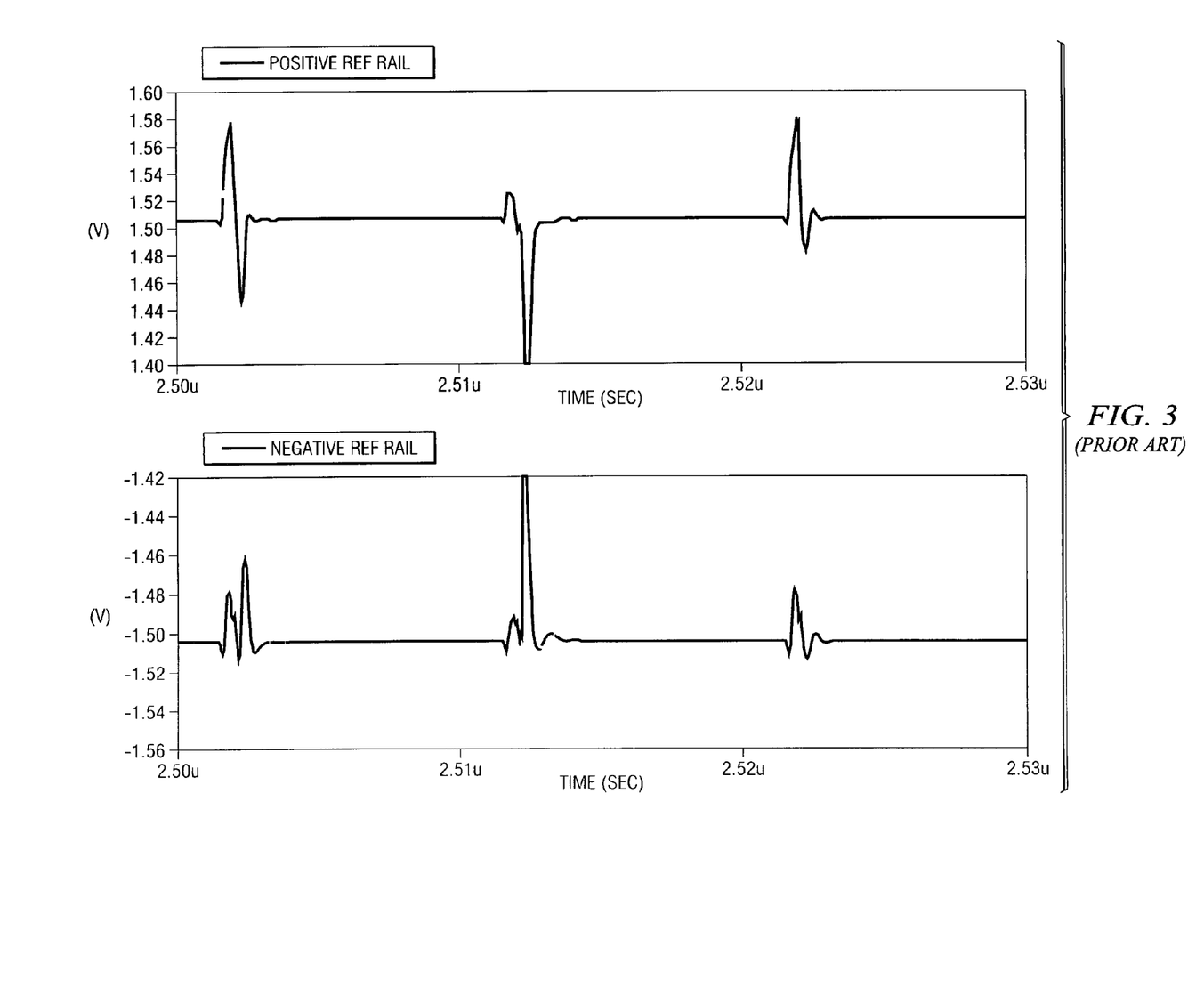
FIG. 3 depicts typical voltage pulse trains found on the voltage reference lines in the circuit of FIG. 1.

One fundamental problem disregarded by prior art implementations, such as circuit 10 of FIG. 1, is the residual sensitivity of the precision regulation circuit to the disturbance coupled into the loop. The typical voltage pulse trains found on the voltage reference lines as a consequence of the cyclical switching action of the quantizer, which of course are signal-dependent (given the MDAC operating principle, the charge injection does contain spectral replicas of the input) are depicted in FIG. 3 for the case of a dual split-supply, ±1.5V reference system. The same pulses will appear attenuated on the capacitors CF inside the loop, and ultimately at the input of the opamp in the loop. Although in principle the pulse trains on the output rails VREF+ and VREF− are symmetrical, a) in reality there will be asymmetries causing imbalances, and b) the non-linearities of the transistor and diode devices, explicit and implicit, inside the OTA used in the regulator will rectify the pulse train components into a waveform with non-zero average. Since the loop encompasses the large capacitor CF driven by a high-impedance output, the dominant pole it features will limit the bandwidth of this subsystem to a few megahertz or even less. Thus, the precision core of the reference system comprised of OTA 12 driving 22 will be sensitive to the rectified area of the signal-dependent disturbance coupled to it, introducing a signal-dependent long-term drift in the reference level that will eventually modulate the output of the whole ADC. The only other mechanism featuring a time constant slow enough to interject into the extremely narrow bandwidth of the loop is the thermal response of the buffer devices, e.g. the well-known self-heating phenomenon which only happens however in the bipolar case.

Figure 4:
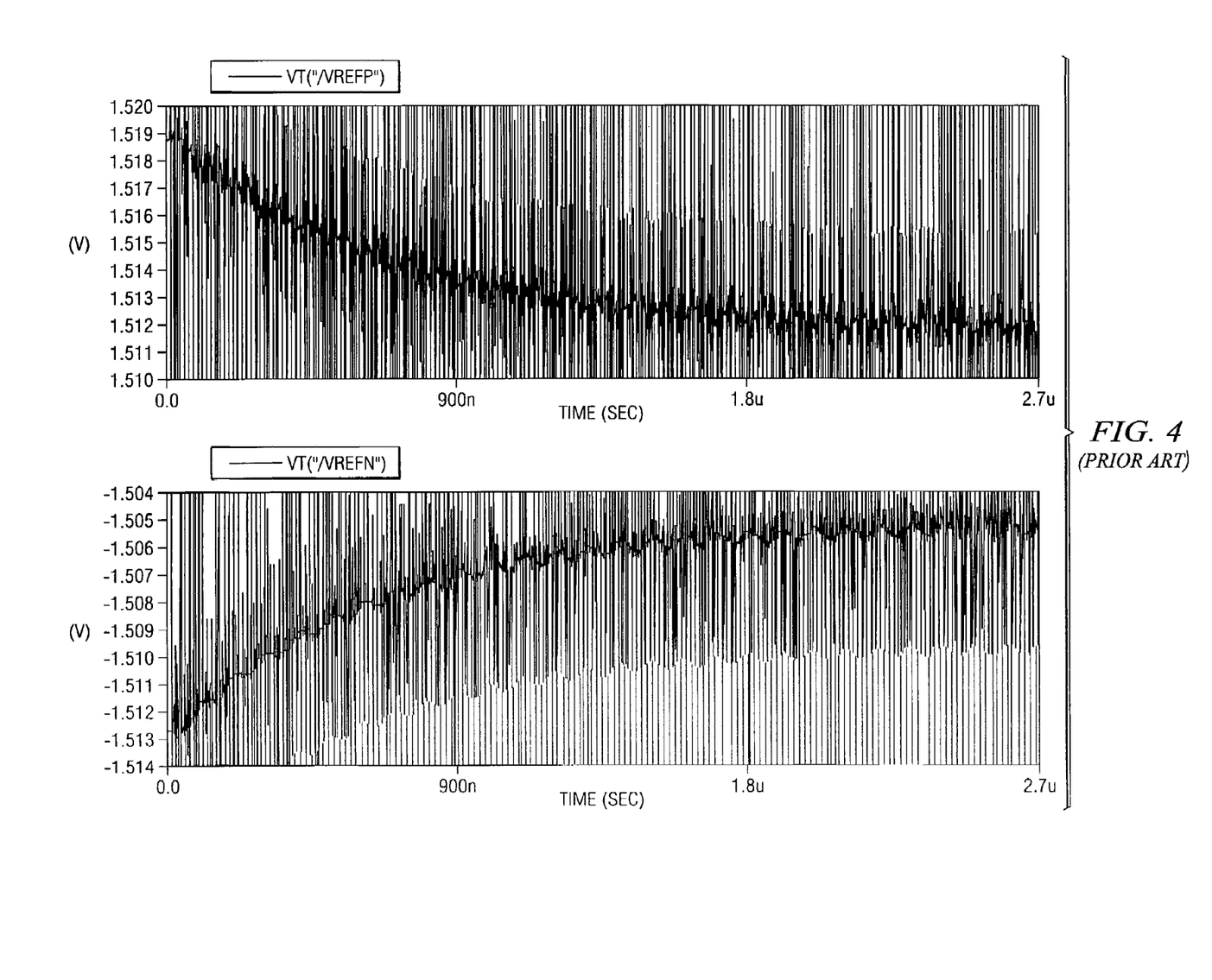
FIG. 4 depicts short-term sinusoidal, and long-term exponential DC voltage drift of the voltage reference lines of the circuit of FIG. 1.
Figure 5:
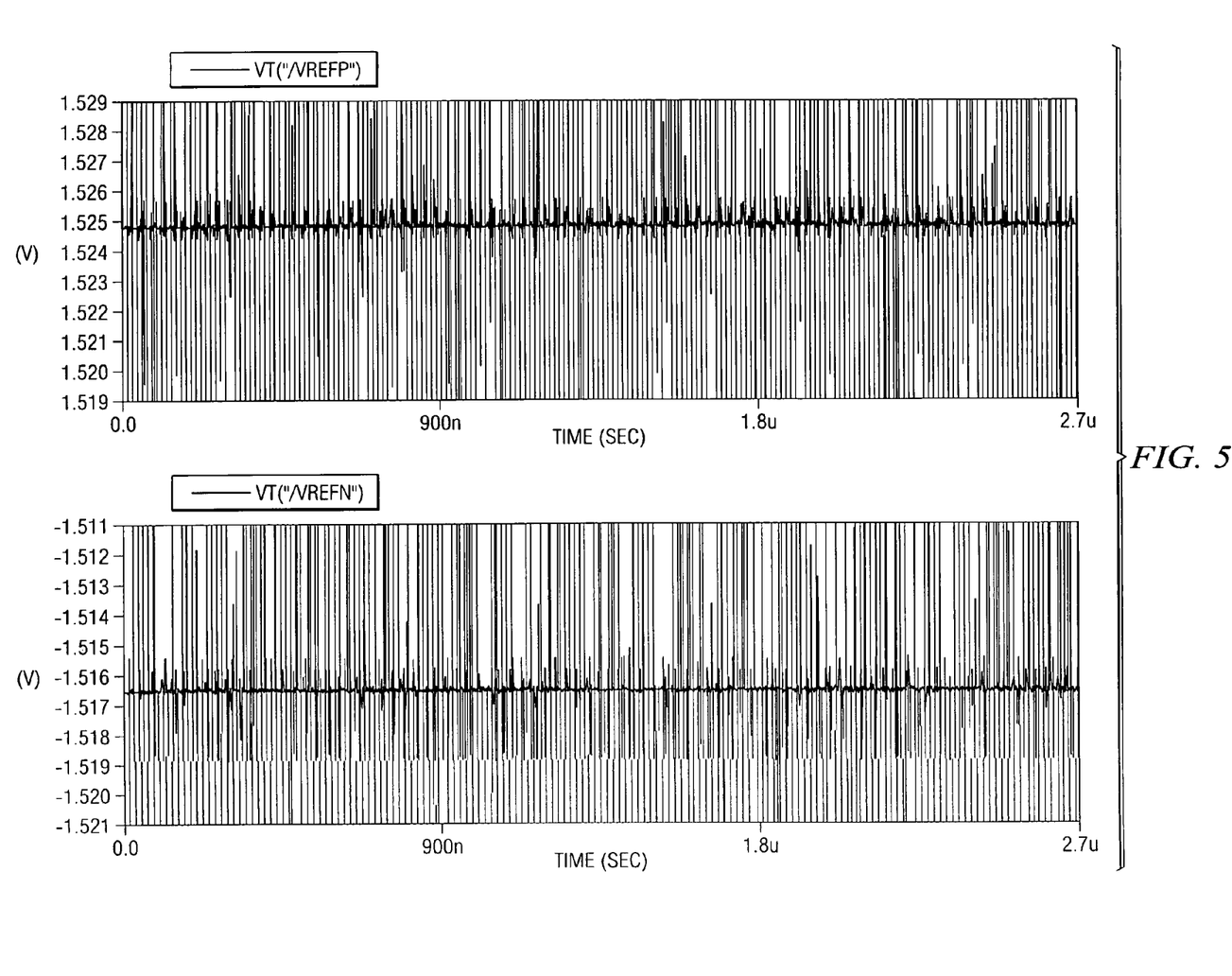
FIG. 5 depicts the DC voltage drift of the voltage reference lines as stabilized by the circuit of FIG. 2.

Simulated evidence of the impact of these subtle rectification mechanisms is provided in FIGS. 4 and 5. The plots depict the behavior of the VREFP (for positive) and VREFN (for negative) rails as labeled in the circuits of FIGS. 1 and 2, respectively. The voltages presented are both evidently affected by large spikes induced by the switched-capacitor operating mode, as seen in FIG. 3. However, when the average settled voltage on the voltage rails is inspected, it is apparent that the output of the prior art circuit 10 as lines 14 and 16 is impacted to a much larger extent by the sinusoidal signal modulating the pulse trains, along with exponentially decaying DC drift, as opposed to that on lines 30 and 32 of circuit 20. FIG. 4 has been obtained by simulating the prior art circuit 10 shown in FIG. 1, completed with an additional level of buffering (as 26 in FIG. 2) placed between nodes A and B. This in order to better approximate the simulation conditions typical of the invention, making for the strongest evidence.

The Spice simulation in FIG. 4 shows about an 8 mV voltage variation single-ended, when a sinusoidal rail-to-rail voltage signal of +1.5V−(−1.5V)=3V single-ended (i.e. 6V peak-to-peak) is imposed on the capacitors being driven by the reference lines. The modulation introduced by the 10 MHz signal is clearly visible, as a distorted 0.5 mV-amplitude sinusoid superimposed to the general trend. FIG. 5 reports the same two outputs at outputs 30 and 32 as simulated on the circuit 20 of FIG. 2, where a) the opamp 12 inside the loop, b) the drive capability of the last buffer (6 mA total), c) the drive capability of the driver in front of it (300 μA total), and d) the switching load, are all kept identical for sake of comparison. The enhanced stability is quite apparent in both respects: the long-term drift and the signal content in the reference voltages, since no detectable modulation is visible on the same scale as FIG. 4.

Figure 6:
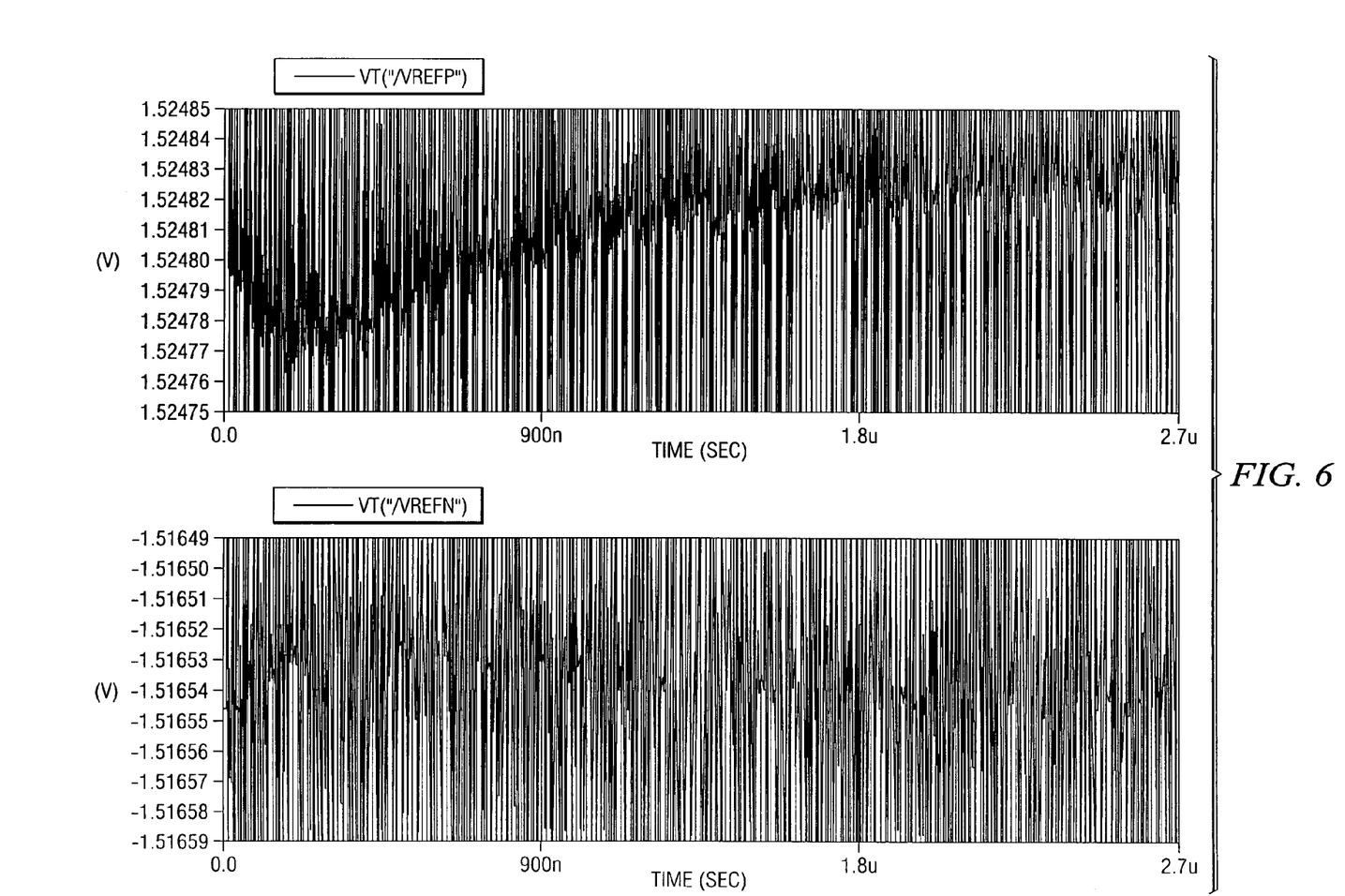
FIG. 6 is a close-up of FIG. 5 highlighting the stability of the voltage reference lines of the circuit of FIG. 2.

In order to appreciate the variations in the voltages on lines 30 and 32, the scale has to be magnified up to 300×, or about 50 dB, as in FIG. 6 from which a total drift of about 25 μV maximum (vs 8 mV), and residual sinusoidal content of 10 μV peak-to-peak (vs 0.5 mV) are visible. Notice that the circuit 20 yields a non-monotonic voltage transient (the final average point is very close to the initial one, after a temporary divergence), rather than a monotonically divergent drift direction.

Figure 7:
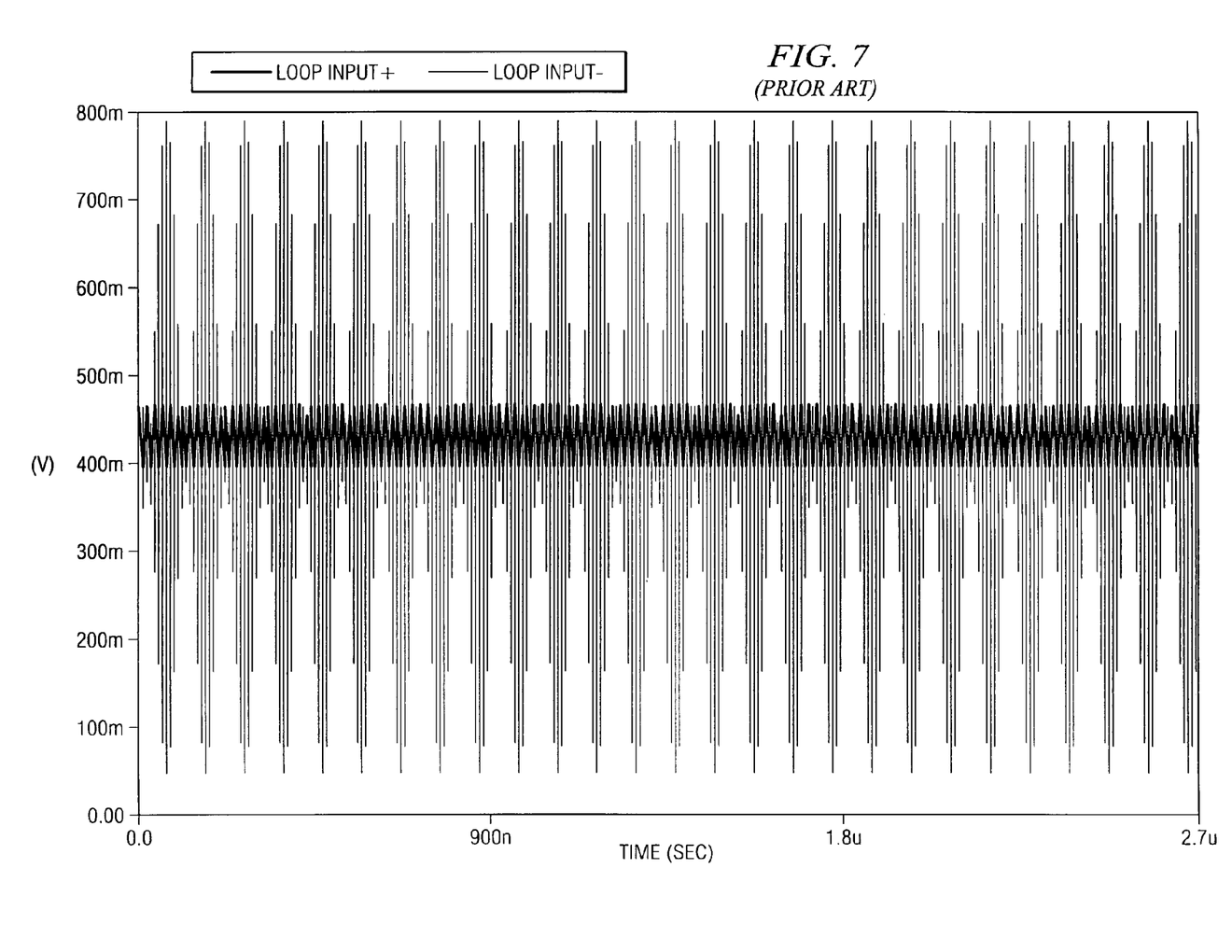
FIG. 7 depicts the voltages at the inputs of the operational amplifier in FIG. 1.
Figure 8:
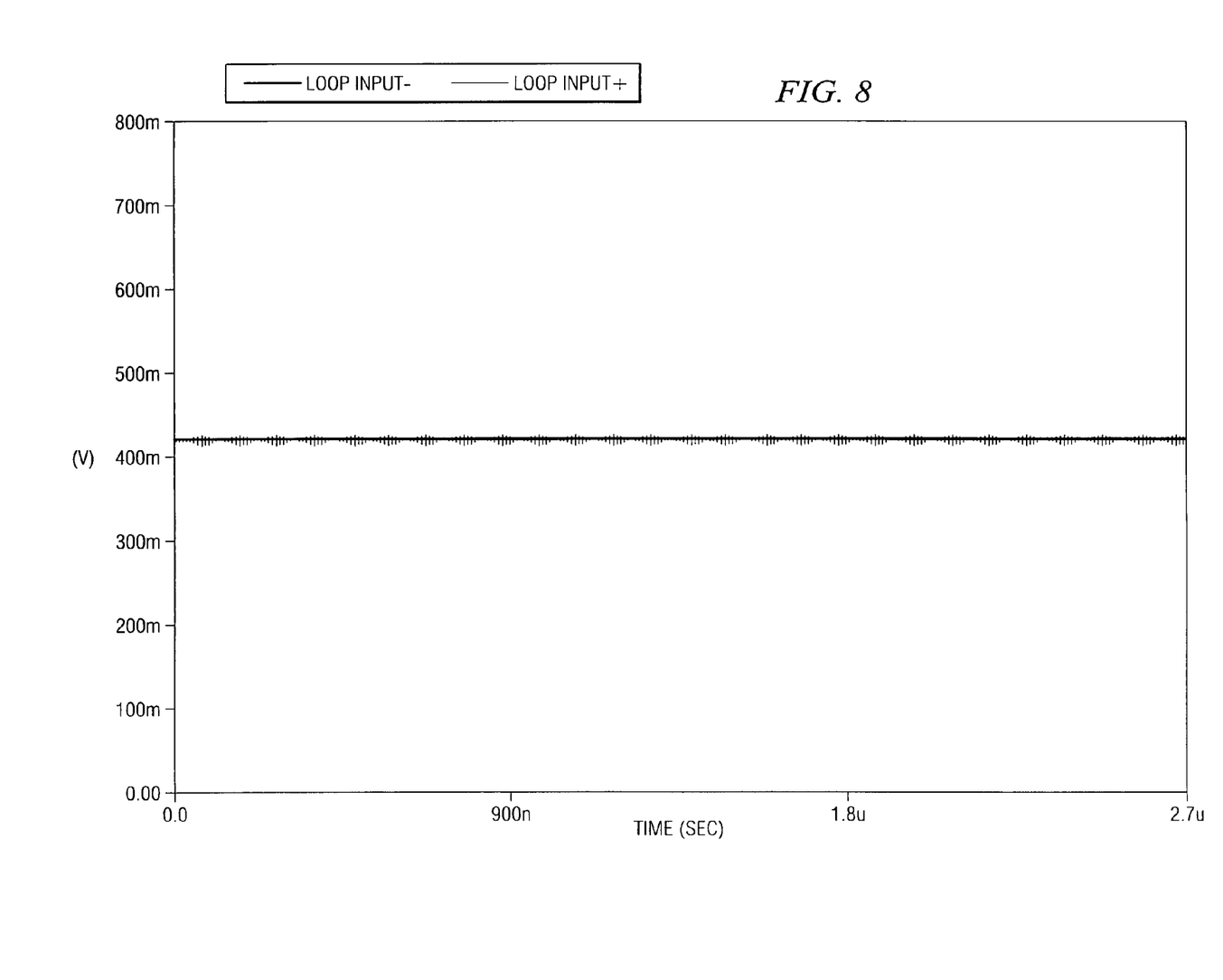
FIG. 8 depicts the voltages at the inputs of the operational amplifier in FIG. 2.

The extent of the benefit provided by the invention is further documented in FIGS. 7 and 8, illustrating the voltages as recorded at the two inputs of the operational amplifier 12 included in the negative feedback loop for circuits 10 and 20, respectively. As depicted in FIG. 7, the prior art circuit 10 shows clear residues of the switching noise coupling reaching beyond the line driver (points A, B in FIG. 1) and leading to the rectification process that ultimately engenders the remarkable drift shown in FIG. 4; whereas the invention yields a superiorly clean voltage, and barely an appreciable signal-dependent modulation at 10 MHz. The differential images of the coupling so evident in FIG. 7 are due to the frequency of the coupling spectral components being well beyond the effective bandwidth of the loop, which cannot reject them by pulling the inputs closer.

Figure 9:
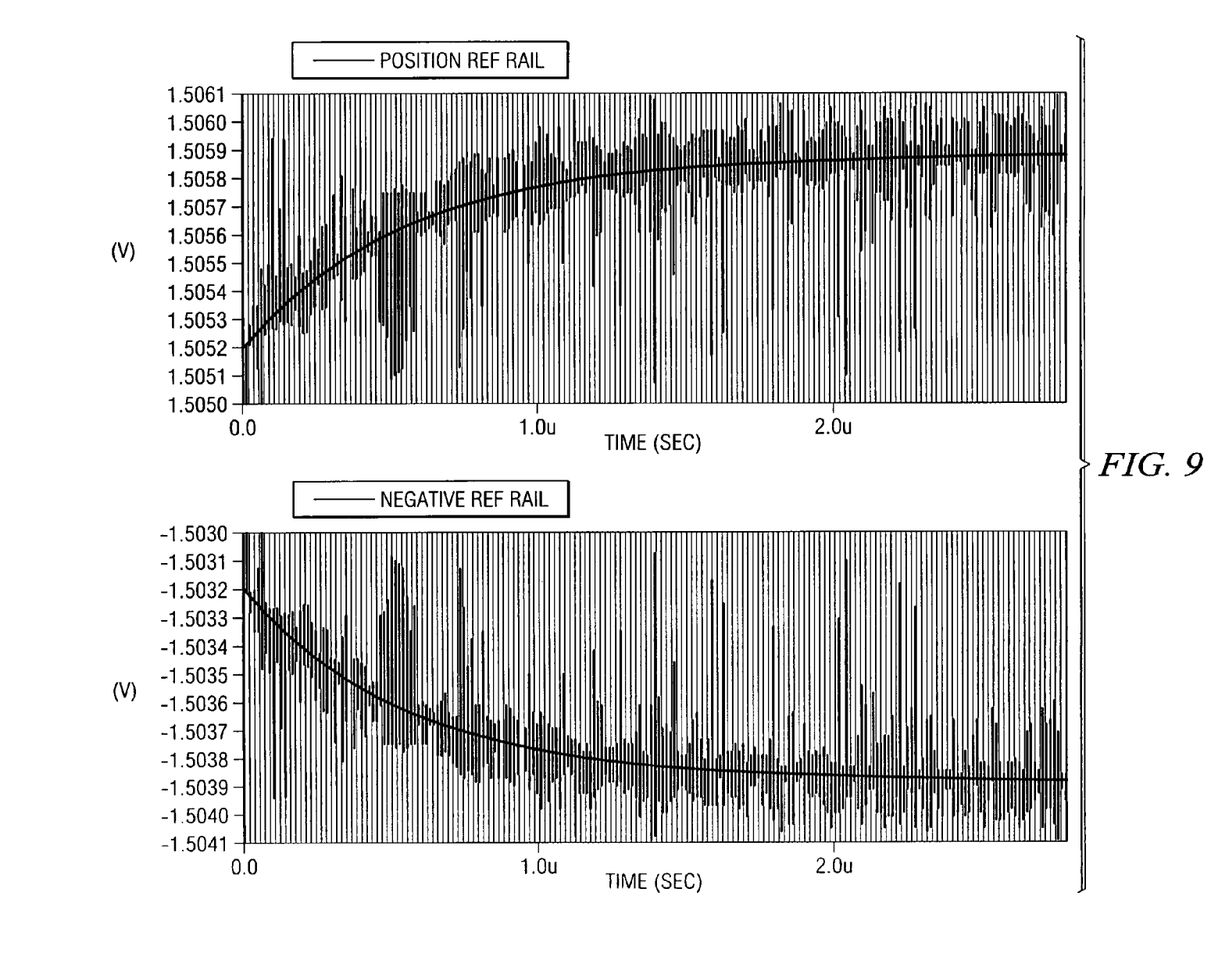
FIG. 9 depicts the residual long-term DC drift due to the self-heating phenomena for the circuit of FIG. 2.

The previous simulations have been carried out without taking into account self-heating mechanisms. The residual long-term ("DC") drift found in the invention will actually be worsened by the onset of self-heating phenomena in the circuit 20, as verified in FIG. 9 where self-heating was enabled in the Spice simulator engine. The drift reaches 800 μV, still a factor of 10 better than in prior art. Since the drift is only due to the aforementioned self-heating of the devices, it can be practically mitigated by either operating the bipolar devices at much lower current density, or, adopting MOSFET devices, if the charging currents required by the signal capacitors allow so. In any case, this second-order effect may diminish but surely not void the clear advantages offered by the invention over prior art.

Figure 10:
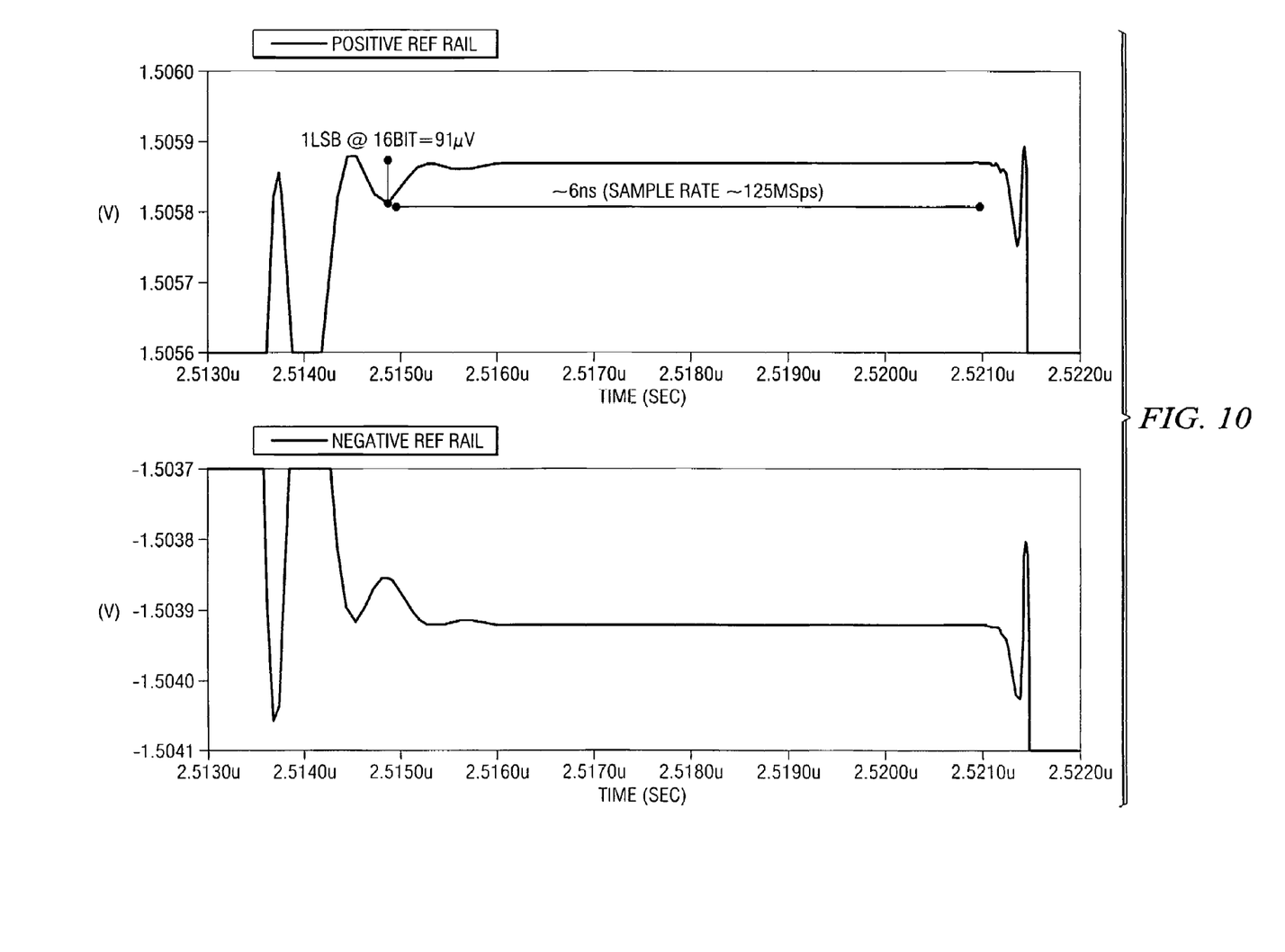
FIG. 10 depicts the transient's speed of the open-loop driver of FIG. 2.

Finally, the inherent speed of the open-loop driver 24 in the frame of the invention is documented in FIG. 10, where the settling transients on the voltage reference lines during a semi-period of the pipelined ADC run at 50 MSample/s clock are plotted. The settling time at 1 LSB for a 16-bit ADC, i.e. measured at 6 Vpp/$2^{16}$=91 μV, leaves about 6 ns available for subsequent pipeline conversion. This projects a reference system speed about (20 ns/2−6 ns)=4 ns, for a period of 2×4 ns=8 ns, i.e. a state-of-the-art maximum sampling rate of 125 MSample/s at the 16 bit accuracy level.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A reference buffer circuit comprising:
   a feedback loop including an operational amplifier having a stable voltage input and driving a closed-loop or single-ended buffer providing first and second reference bias voltages; and
   an open-loop buffer coupled to the closed-loop or single-ended buffer and providing a first and a second output voltage reference, wherein the open-loop buffer is a substantial replica of the closed-loop or single-ended buffer.

2. The reference buffer circuit as described in claim 1 wherein the closed-loop or single-ended buffer is enclosed within a negative feedback loop.

3. The reference buffer circuit as described in claim 1 wherein the closed-loop or single-ended buffer is configured as a differential buffer.

4. The reference buffer circuit as described in claim 1 wherein the closed-loop buffer is configured as a single-ended buffer.

5. The reference buffer circuit as described in claim 1 wherein the open-loop buffer is configured to substantially improve stability of the first and second reference bias voltages when a signal is coupled to the closed-loop or single-ended buffer input.

6. The reference buffer circuit as described in claim 1 wherein the reference buffer circuit is configured as a low impedance buffer.

7. The reference buffer circuit as described in claim 1 wherein the open-loop buffer is operable to be substantially unaffected by a current surge at the output.

8. The reference buffer circuit as described in claim 7 wherein the open-loop buffer is operable to be substantially unaffected by a high-frequency current surge arising at the output.

9. The reference buffer circuit as described in claim 1 wherein the open-loop buffer is configured as a source-follower circuit including MOSFET devices.

10. The reference buffer circuit as described in claim 1 wherein the current flowing in the open-loop buffer is related with the closed-loop or single ended buffer buffer.

11. A reference buffer circuit comprising:
    a feedback loop including an operational amplifier having a stable voltage input and driving a closed-loop or single ended buffer providing first and second reference bias voltages; and
    an open-loop buffer coupled to the closed-loop or single ended buffer and providing a first and a second output voltage reference, wherein the feedback loop includes a filter capacitor.

12. The reference buffer circuit as described in claim 11 wherein the feedback loop includes an isolation capacitor configured to improve isolation against faster spectral components coupling to the first and second output voltage references.

13. A reference buffer circuit comprising:
    a feedback loop including an operational amplifier having a stable voltage input and driving a closed-loop or single ended buffer providing first and second reference bias voltages; and
    a plurality of staggered open-loop buffers coupled to the closed-loop or single ended buffer and providing a first and a second output voltage reference, said open-loop buffers configured to improve stability of the first and second voltage references.

14. A reference buffer circuit comprising:

a feedback loop including an operational amplifier having a stable voltage input and driving a closed-loop or single ended buffer providing first and second reference bias voltages;

an open-loop buffer coupled to the closed-loop or single ended buffer and providing a first and a second output voltage reference; and a quantizer of an analog-to-digital converter (ADC) coupled to the reference buffer circuit.

15. The reference buffer circuit as described in claim 14 wherein the ADC is a switched capacitor pipeline ADC.

16. A reference buffer circuit comprising:

a feedback loop including an operational amplifier having a stable voltage input and driving a closed-loop or single ended buffer providing first and second reference bias voltages; and an open-loop buffer coupled to the closed-loop or single ended buffer and providing a first and a second output voltage reference, wherein the open-loop buffer is operable as an emitter-follower circuit including bipolar devices.

17. A reference buffer circuit comprising:

a feedback loop including an operational amplifier having a stable voltage input and driving a closed-loop or single ended buffer providing first and second reference bias voltages; and an open-loop buffer coupled to the closed-loop or single ended buffer and providing a first and a second output voltage reference, wherein the closed-loop or single ended buffer is enclosed within a negative feedback loop, and wherein the open-loop buffer matches the closed-loop or single ended buffer.

18. A reference buffer circuit comprising:

a feedback loop including an operational amplifier having a stable voltage input and driving a closed-loop or single ended buffer providing first and second reference bias voltages; and an open-loop buffer coupled to the closed-loop or single ended buffer and providing a first and a second output voltage reference, wherein the open-loop buffer is configured to substantially improve stability of the first and second reference bias voltages when a signal is coupled to the closed-loop buffer input, and wherein the open-loop buffer rejects the spectral components extending beyond an effective bandwidth of the closed-loop or single ended buffer.

19. A reference buffer circuit comprising:

a feedback loop including an operational amplifier having a stable voltage input and driving a closed-loop or single ended buffer providing first and second reference bias voltages; and an open-loop buffer coupled to the closed-loop or single ended buffer and providing a first and a second output voltage reference, wherein the reference buffer circuit is configured as a low impedance buffer, and wherein the open-loop buffer maintains a speed of the closed-loop or single ended buffer.

* * * * *